United States Patent [19]
Wada et al.

[11] Patent Number: 5,307,307
[45] Date of Patent: Apr. 26, 1994

[54] SEMICONDUCTOR MEMORY DEVICE HAVING IMPROVED BIT LINE ARRANGEMENT

[75] Inventors: Tomohisa Wada; Katsuki Ichinose, both of Hyogo, Japan

[73] Assignee: Mitsubishi Denki Kabushiki Kaisha, Tokyo, Japan

[21] Appl. No.: 495,037

[22] Filed: Mar. 16, 1990

[30] Foreign Application Priority Data

Mar. 20, 1989 [JP] Japan .................................. 1-68005

[51] Int. Cl.⁵ ....................... G11C 13/00; G11C 11/00
[52] U.S. Cl. ........................................ 365/51; 365/63; 365/189.06; 365/230.01
[58] Field of Search ...................... 365/51, 63, 189.06, 365/189.01, 230.01

[56] References Cited
U.S. PATENT DOCUMENTS 4,658,377 4/1987 McElroy .............................. 365/149
4,916,666 4/1990 Fukuhama et al. ................. 365/207

OTHER PUBLICATIONS

"A 34-ns 1-Mbit CMOS SRAM Using Triple Polysilicon", IEEE Journal of Solid-State Circuits, Oct. 1987, vol. SC-22, No. 5, pp. 727-731 by Tomohisa Wada, Toshihiko Hirose, Hirofumi Shinohara, Yuji Kawai, Kojiro Yuzuriha, Yoshio Kohno, and Shimpei Kayano.

Primary Examiner—Terrell W. Fears
Attorney, Agent, or Firm—Lowe, Price, LeBlanc & Becker

[57] ABSTRACT

A semiconductor memory device includes a memory cell array composed of a plurality of memory cells. The memory cell array includes a plurality of word lines interconnecting the memory cells in the row direction and a plurality of bit line pairs interconnecting the memory cells in the column direction. One end of each bit line pair is connected to a clamping circuit, while the other end of each bit line pair is connected via a column select gate to a read/write circuit. Each bit line pair is bent about centrally in the two-dimensional form of a letter U and the clamping circuit and the column select gate are disposed alternately on one same straight line.

12 Claims, 12 Drawing Sheets

5,307,307

SEMICONDUCTOR MEMORY DEVICE HAVING IMPROVED BIT LINE ARRANGEMENT

BACKGROUND OF THE INVENTION

1. Field of the Invention

This invention relates to a semiconductor memory device and, more particularly, to an improvement in the arrangement of various circuits in semiconductor memory devices, such as, for example, a static random access memory (referred to hereinafter as a static RAM) or a dynamic random access memory (referred to hereinafter as a dynamic RAM).

2. Description of the Prior Art

FIG. 11 is a schematic block diagram showing the construction of a static RAM as an example of the conventional static semiconductor memory device. Such conventional static RAM is disclosed in, for example, Japanese Patent Laying-Open No. 63-893. Referring to FIG. 11, a memory cell array 1 is formed by a two-dimensional array of a plurality of memory cells, not shown, arranged in the column direction and in the row direction. A row address input signal supplied from outside of the static RAM is transmitted via a row address buffer 2 to a row decoder 3. The row decoder 3 is responsive to this row address input signal to select a row select line which is not shown (referred to hereinafter as a word line) for selecting memory cells constituting the memory cell array 1 row by row. Similarly, an externally supplied column address input signal is applied to a column decoder 5 via a column address buffer 4. The column decoder 5 is responsive to this column address input signal to drive a column select gate, not shown, as later described, to select each column of the memory cell array 1. During read-out, the data that is stored in the memory cell selected by the row decoder 3 and the column decoder 5 is read out via a read circuit 6 so as to be applied to a data output buffer 7. The read-out data is outputted via a terminal 8 from the data output buffer 7. On the other hand, during data writing, write data is entered via a terminal 9, and is applied via a data input buffer 10 to a write circuit 11. The write circuit 11 is responsive to the write data to write the data in the memory cell selected by the row decoder 3 and the column decoder 5. The operations of the read circuit 6, the data output buffer 7, the data input buffer 10 and the write circuit 11 are controlled by a read/write control circuit 13 responsive to a read/write control input signal supplied via a terminal 12.

FIG. 12 shows the construction of the memory cell array 1 of FIG. 11 in more detail. In the memory cell array 1 of FIG. 12, plural memory cell elements 14, each functioning as a data storage unit element, are arranged in a two-dimensional manner in the row direction and in the column direction. The memory cells 14 are connected to respective word lines 15 each for selecting the memory cells for one row. Each word line is selected by the row decoder 3.

The memory cells 14 of each column are connected to a pair of bit lines 16. It is by way of these bit line pairs that data are read out from the memory cells 14 or applied to the memory cells 14. Each bit line pair 16 has its one end connected to an associated clamping circuit 17, each clamping circuit 17 functioning as a bit line load for charging the associated bit line pair 16 to a predetermined potential. Each bit line pair 16 has its other end connected via an associated column select gate 18 to a read/write circuit 19. Each column select gate 18 is constituted by a pair of MOS transistors having their control electrodes connected in common. The control electrodes of these MOS transistors are supplied with a signal from a column decoder, not shown, such as the column decoder 5 of FIG. 11. As a result, one of a plurality of column select gates 18 is opened and one of a plurality of bit line pairs is selected and connected to the read/write circuit 19. This read/write circuit 19 has the function of both the read circuit 6 and the write circuit 11 shown in FIG. 11. This read/write circuit 19 is usually provided one for several columns of memory cells, such as, for example, a $2^n$ number of columns (n being a positive integer). In this prior-art example, one read/write circuit 19 is provided for two consecutive columns.

The read/write operation of the memory cells shown in FIG. 12 is now explained. During read-out, the row decoder 13 is responsive to the row address input signal to select one of a large number of word lines 15 to which a memory cell from which data is desired to be read out is connected. This causes the data stored in the memory cells 14 connected to the selected word line 15 to appear on the associated bit line pairs 16.

The column decoder 5 is responsive to the column address input signal to turn on the MOS transistors of the column select gate 18 associated with the column including the memory cell from which the data is desired to be read out. As a result, the data stored in the memory cell 14 selected by the row decoder 3 and the column decoder 5 is transmitted via the bit line pair 16 and the column select gate 18 to the read/write circuit 19. The read-out circuit section, not shown, of the read/write circuit 19 is activated by the control signal from the read/write control circuit 13 of FIG. 11 to amplify signal data of extremely small amplitude read out from the memory cell 14 to output the amplified signal data to the outside via a data output buffer 7 shown in FIG. 11.

During writing, the write circuit section, not shown, of the read/write circuit 19 is activated by the control signal from the read/write control circuit 13 of FIG. 11 to write the data via a column select gate 18 and a bit line pair 16 in the desired memory cell selected in the same manner as during reading.

Meanwhile, the potentials at the non-selected bit line pairs are clamped by the above mentioned clamping circuits 17, each acting as a bit line load, at a suitable potential of not inverting the data of the memory cells.

The semiconductor memory device of the above described construction is disclosed in, for example, "a 34-ns 1-Mbit CMOS SRAM Using Triple Polysilicon" by T. Wada et al. appearing IEEE Journal of Solid-State Circuits, Vol. SC-22, No. 5, pp. 727 to 732, issued in October, 1987.

In the above described conventional semiconductor memory device, a clamping circuit 17 and a column select gate 18 are required for each column or bit line pair 16. For keeping with the tendency towards a higher degree of integration, the width of each column is reduced, so that the widths of the clamping circuit 17 and the column select gate 18 need be reduced correspondingly. With the progress in the degree of integration, several problems have been presented in arranging the clamping circuits 17 and the column select gates 18 on the semiconductor chip. More specifically, in the memory cell array 1 shown in FIG. 12, the pitch of arrangement of the clamping circuit 17 and the column select gate 18 on the semiconductor chip is dominated by the one having a larger width of the clamping circuit 17 and the column select gate 18. That is, in the memory cell array 1 of FIG. 12, since the clamping circuit 17 has a larger width than the column select gate 18, the pitch of arrangement is dominated only by the width of the clamping circuit 17, such that a certain limit is placed on improving circuit integration thus resulting in the limited degree of freedom in circuit designing.

In addition, in the above described conventional semiconductor memory device, read/write circuits are arranged at a rate of one for several columns, for example, two columns in the prior-art example of FIG. 12. Thus, when the bit line pair width is reduced to keep pace with the high integration, the following problem is presented in arranging the read/write circuits on the semiconductor chip. That is, in FIG. 12, the transverse length, or width, of the read/write circuit corresponds to two bit line pairs. Since each memory cell is made up of four transistors, only several transistors can be arrayed over an extent limited by such width. However, inasmuch as the read/write circuit 19 is usually made up of several tens of transistors, the longitudinal extent of the read/write circuit 19 is necessarily increased with the result that the arrangement of the read/write circuits becomes difficult on the semiconductor chip so that the degree of freedom in circuit designing is correspondingly limited.

On the other hand, the Japanese Patent Laying-Open No. 63-10396 discloses an intersecting system of bit lines in the semiconductor memory device. However, there is not shown as yet a construction in which the bit line pairs are bent or turned down substantially in the two-dimensional form of a letter U.

SUMMARY OF THE INVENTION

It is an object of the present invention to realize a higher degree of integration of a semiconductor integrated circuit.

It is another object of the present invention to improve the degree of freedom in designing the semiconductor integrated circuit.

It is a further object of the present invention to release the constraint on the pitch of the arrangement of clamping circuit, column select gate, write/read circuit or the like on the semiconductor chip.

The semiconductor memory device according to the present invention includes a memory cell array made up of a plurality of memory cells arranged two-dimensionally in the row direction and in the column direction, these memory cells being connected with one another in the column direction by a plurality of bit line pairs. Each of these bit line pairs is bent in the two-dimensional form of a letter U at at least one position.

According to another aspect of the present invention, the semiconductor memory device includes first circuits connected to respective one ends of a plurality of bit lines and each having a predetermined function, and second circuits connected to the respective other ends of a plurality of bit lines and each having a predetermined function different from that of the first circuit. The first and second circuits are disposed alternately.

According to a further aspect of the present invention, each of the bit lines is disposed so as to be branched two-dimensionally, with at least one of the first circuit and the second circuit having mutually different functions as a branching point.

In the semiconductor memory device of the present invention, the bit line pairs are bent substantially in the two-dimensional form of a letter U at at least one position, so that the restrictions on the pitch of arrangement of the memory cell columns on the semiconductor chip may be released to increase the degree of freedom in designing peripheral circuits.

Also, inasmuch as the first circuits connected to respective one ends of the bit lines and each having the predetermined function and the second circuits connected to the respective other ends of the bit lines and each having a different function are disposed alternately, the restrictions on the pitch of the arrangement of columns of the memory cells may similarly be released.

Also, inasmuch as the bit lines are branched two-dimensionally, with at least one of the first circuit and the second circuit having mutually different functions as the branching point, the restrictions on the pitch of the arrangement may similarly be released, while the degree of freedom in designing the circuits may be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
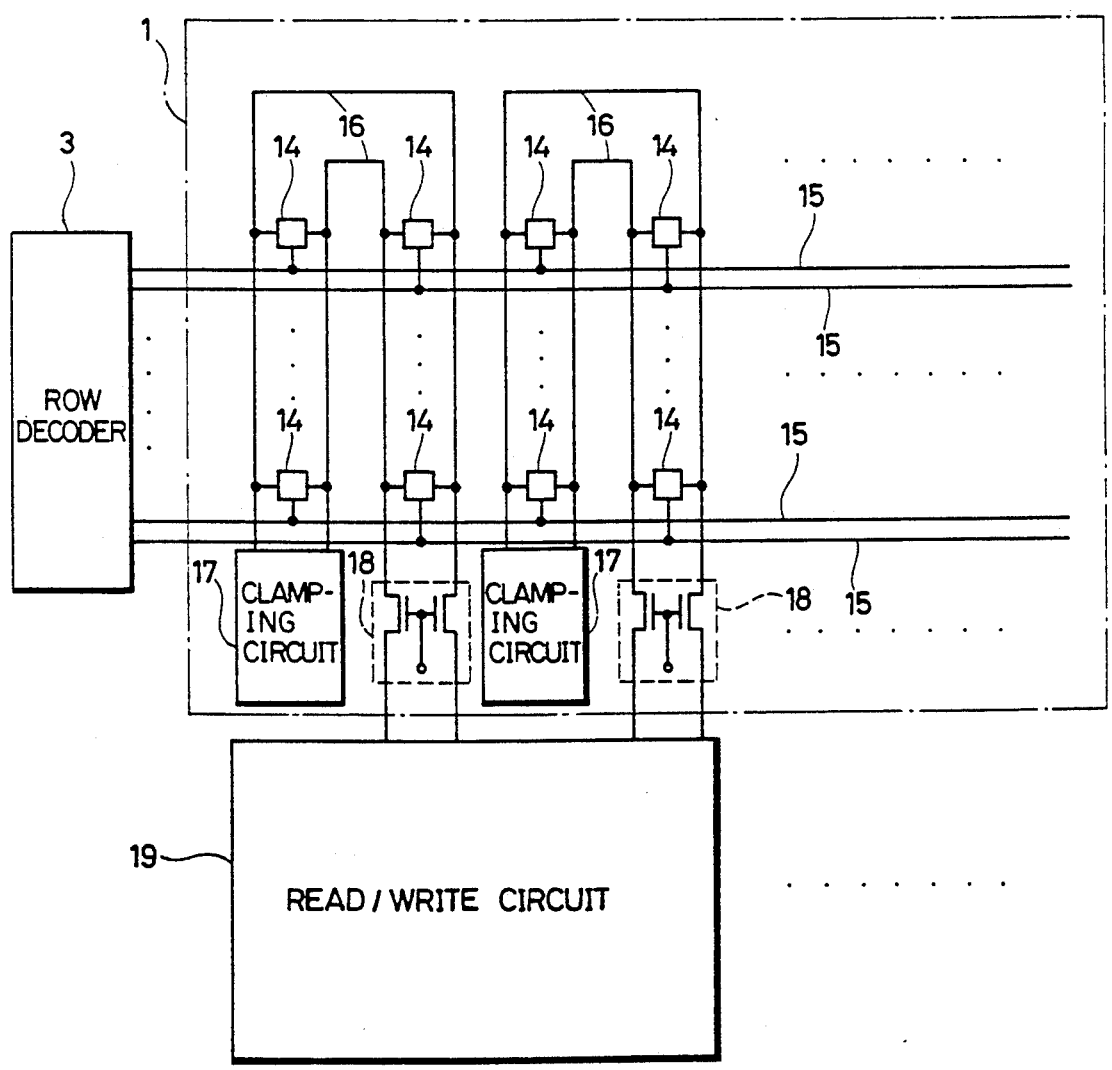
FIG. 1 is a block diagram showing a first embodiment of the present invention.

FIG. 1 is a block diagram showing the construction of a memory cell array of a static RAM according to a first embodiment of the present invention. The memory cell array shown in FIG. 1 is the same as the conventional memory cell array shown in FIG. 12 except for the following points. In the embodiment of FIG. 1, each bit line pair 16 is bent once halfway in the two-dimensional form of a letter U, so that the clamping circuits 17 and the column select gates 18 are disposed alternately in one column. As a result, the memory cell column pitch is not dominated only by the width of the clamping circuit 17 as in FIG. 12. The space allowance in the arrangement of the column select gates 18 of FIG. 12 may be utilized by other circuits, so that the degree of integration of the memory cell array as a whole may be improved.

Figure 12:
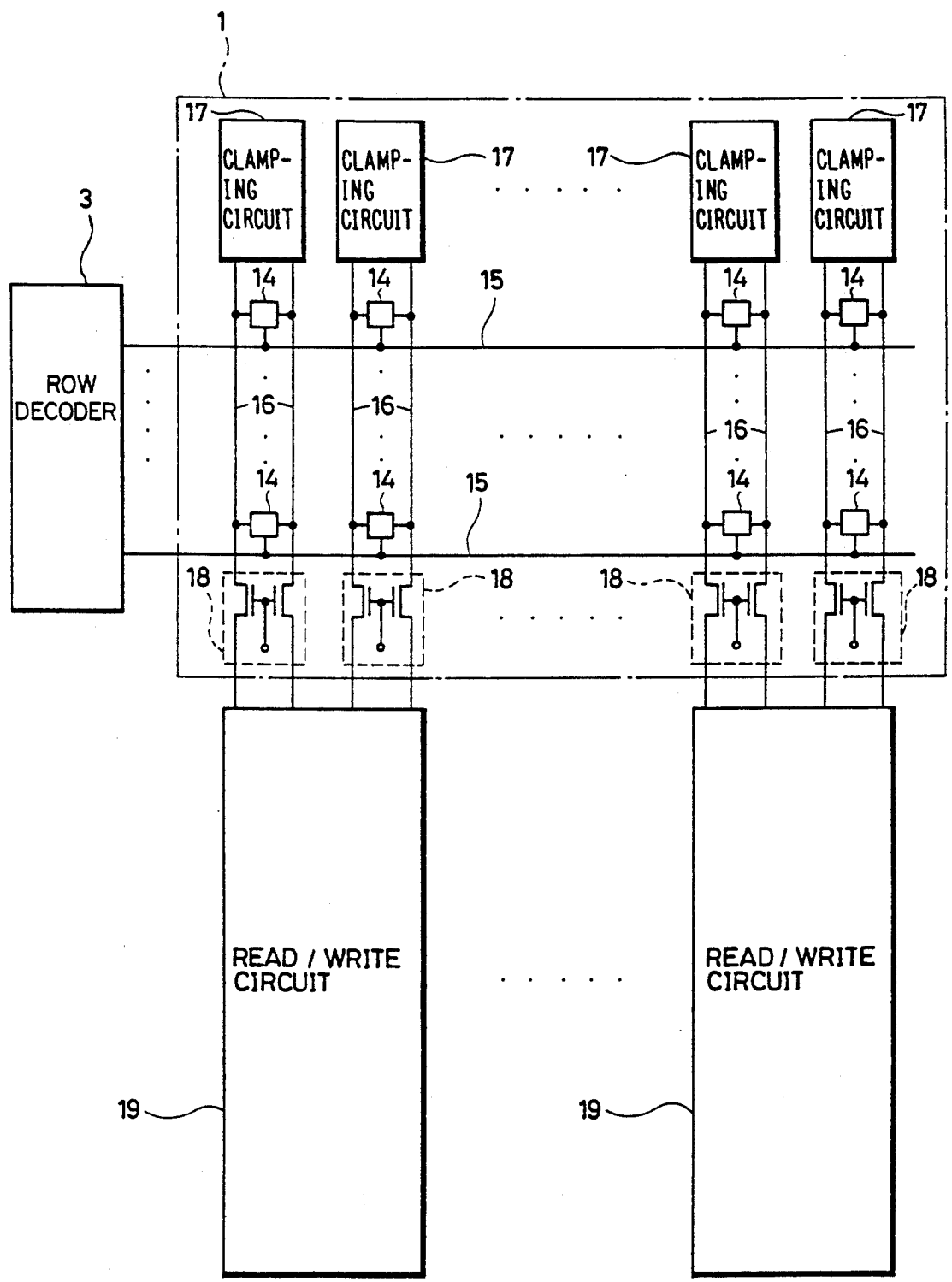
FIG. 12 is a detailed block diagram showing the memory cell array of the conventional static RAM shown in FIG. 11.

On the other hand, the width of the read/write circuit 19 may be doubled from the two columns of bit line pairs as in FIG. 12 to four columns of the bit line pairs, so that the longitudinal extent of the circuit 19 may be reduced correspondingly. As a result, the configuration of the read/write circuit 19 approaches a square resulting in more facilitated arrangement and increased degree of freedom in designing.

Figure 2:
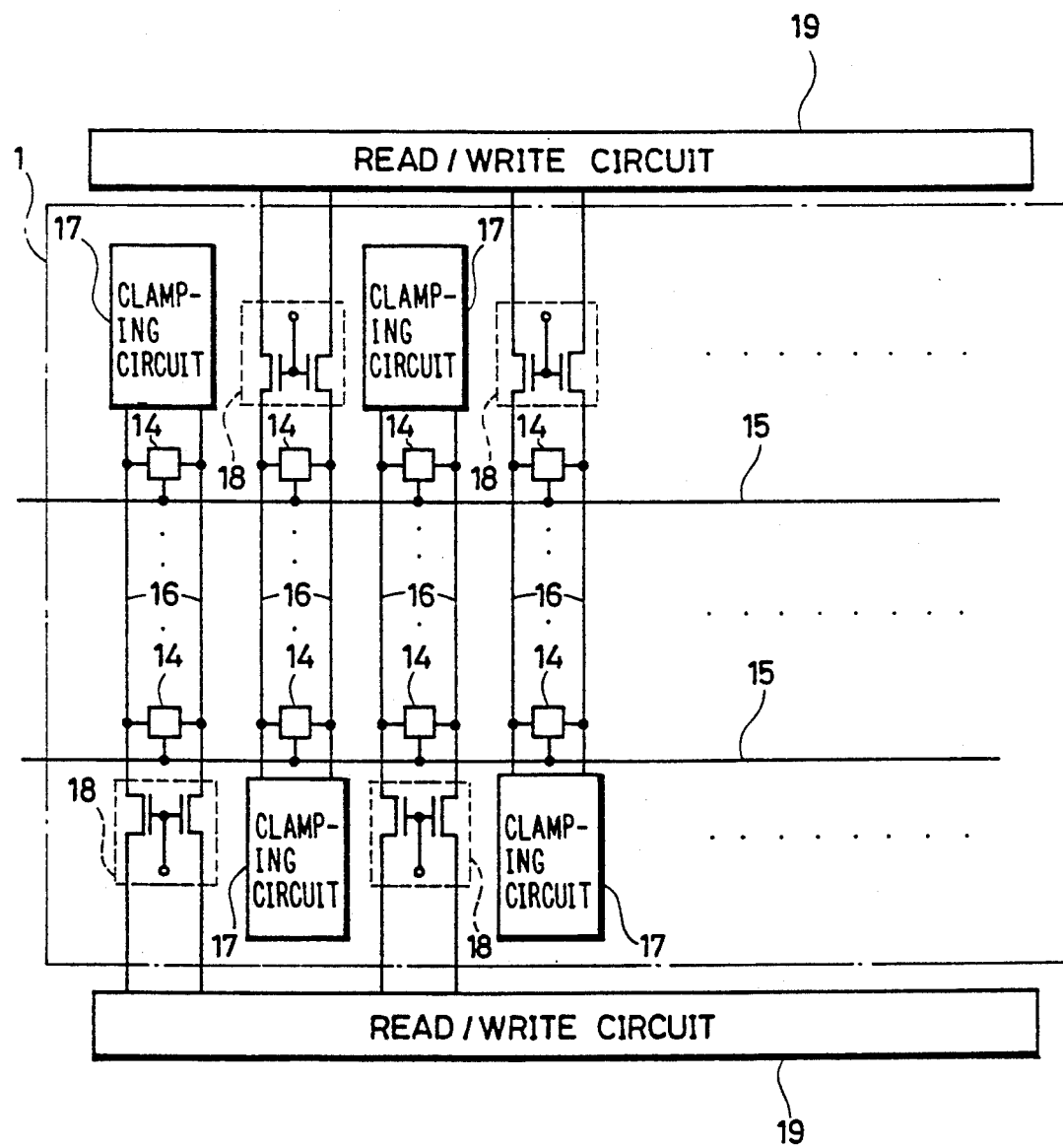
FIG. 2 is a block diagram showing a second embodiment of the present invention.

FIG. 2 is a block diagram showing the construction of a memory cell array of a static RAM according to a second embodiment of the present invention. In FIG. 2, the row decoder 3 is not shown for simplicity. The embodiment of FIG. 2 differs from the first embodiment shown in FIG. 1 in the following points. The read/write circuits 19 are arranged on both sides of the memory cell array 1 so as to oppose to each other, while the clamping circuits 17 and the column select gates 18 are disposed alternately in a straight line in the row direction. As a result, the pitch of the arrangement of memory cell columns is not dominated only by one of the circuit 17 and the gate 18, similarly to the first embodiment shown in FIG. 1, so that the degree of integration of the memory cell array as a whole may be improved. The pitch of the read/write circuits 19 is also doubled, similarly to the first embodiment, again resulting in increased degree of freedom in designing.

Figure 3:
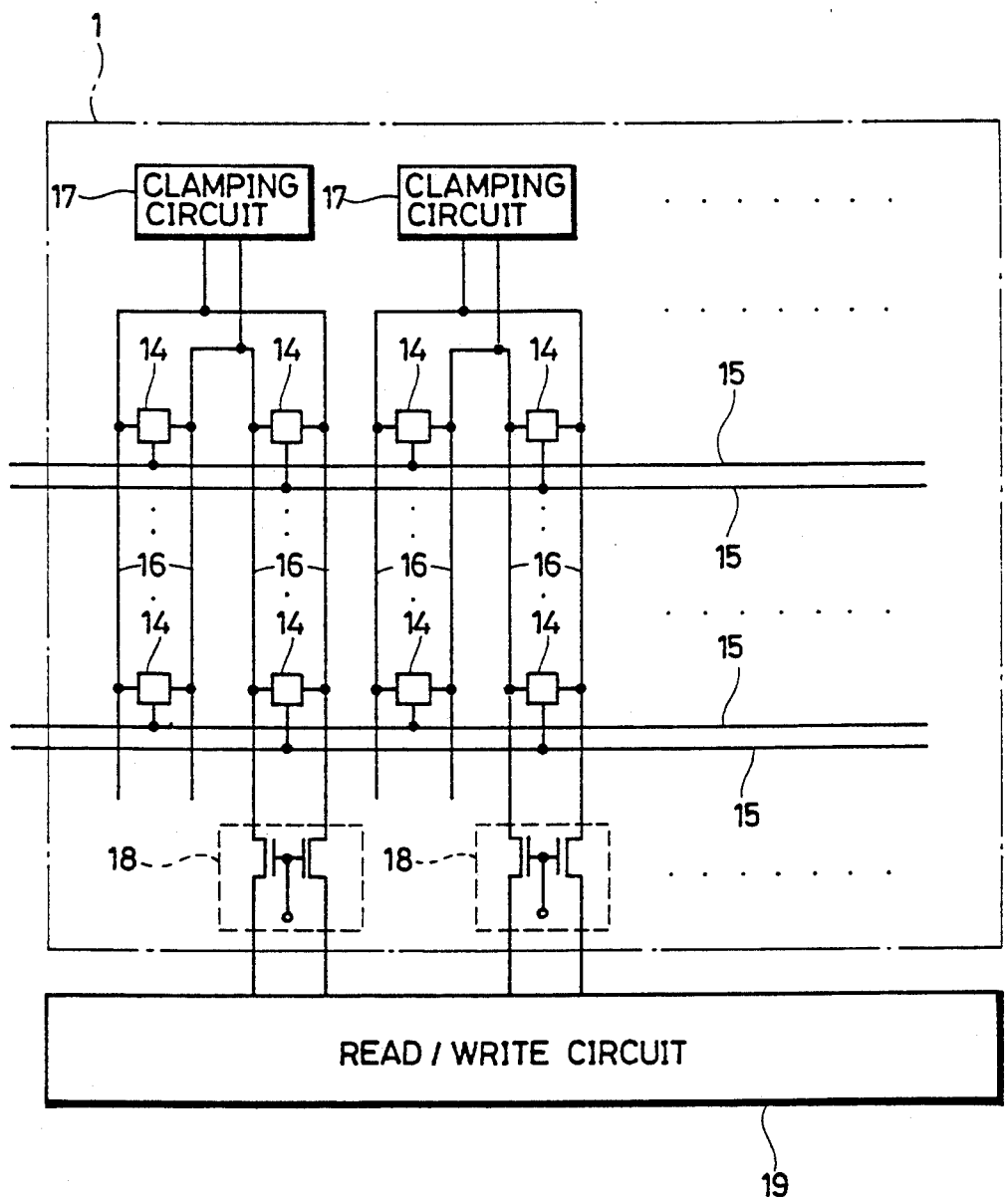
FIG. 3 is a block diagram showing a third embodiment of the present invention.

FIG. 3 is a block diagram showing the construction of a memory cell array of a static RAM according to a third embodiment of the present invention. In this embodiment, each bit line pair 16 is branched two-dimensionally with the clamping circuit 17 as the branching point. One of the branches of the bit line pair is connected via the column select gate 18 to the read/write circuit 19. In the present third embodiment, the arrangement pitches of the clamping circuit 17 and the column select gate 18 are doubled to create a space allowance around the circuit 17 and the gate 18 to improve the degree of freedom in designing the circuit 17 and the gate 18. The pitch of the read/write circuits 19 is also doubled to increase the degree of freedom in designing.

Figure 4:
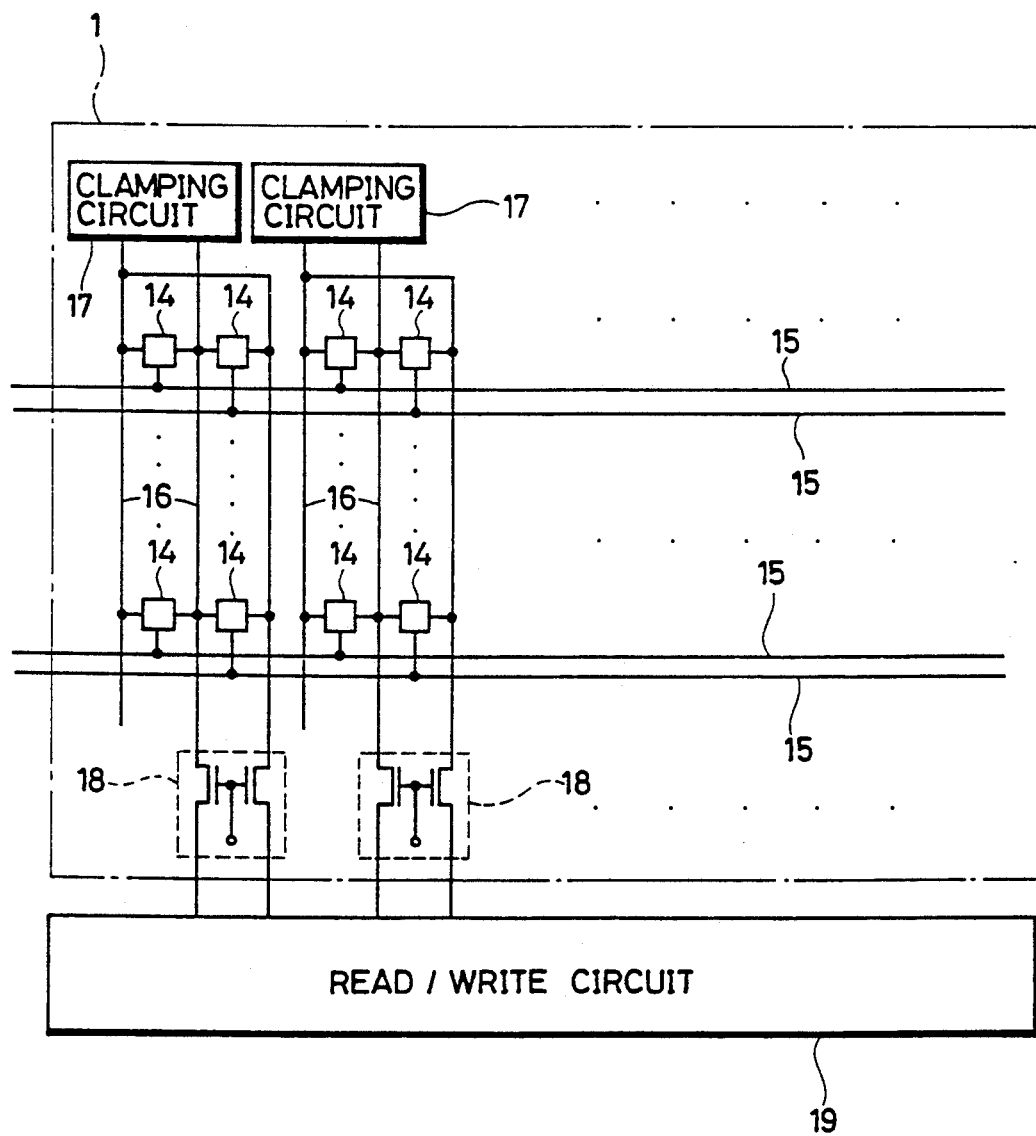
FIG. 4 is a block diagram showing a fourth embodiment of the present invention.

FIG. 4 is a block diagram showing the construction of a memory cell array of a static RAM according to a fourth embodiment of the present invention. The fourth embodiment is a modification of the third embodiment shown in FIG. 3 in that the inner branches of the two adjacent bit line pairs of FIG. 3 are combined into one common bit line. Consequently, in the present fourth embodiment, similarly to the third embodiment, the arrangement pitches of the clamping circuit 17, the column select gate 18 and the read/write circuit 19 are doubled to increase the degree of freedom in designing. Simultaneously, the number of bit lines per memory cell may be decreased to realize a higher degree of circuit integration.

Figure 5:
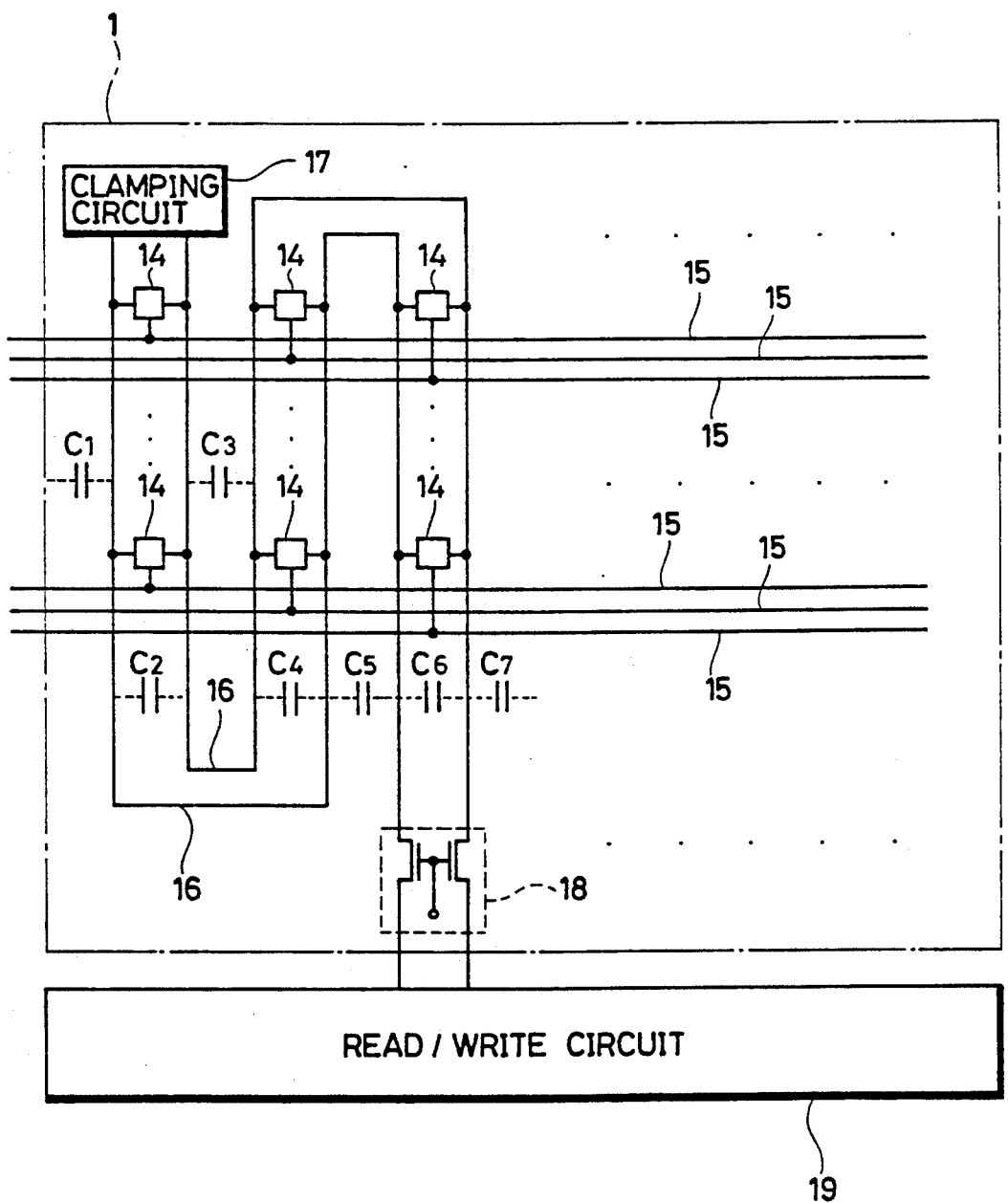
FIG. 5 is a block diagram showing a fifth embodiment of the present invention.

FIG. 5 is a block diagram showing the construction of a memory cell array of a static RAM according to a fifth embodiment of the present invention. In the fifth embodiment, each bit line pair 16 is bent twice halfway in the two-dimensional form of letter U. As a result, the arrangement pitches of the clamping circuit 17, the column select gate 18 and the read/write circuit 19 are tripled to increase the degree of freedom in designing these circuits.

In this situation, the line-to-line capacitances $C_3$ and $C_5$ among the line-to-line capacitances $C_1$ to $C_7$ between the adjacent bit lines become the capacitances between the same bit lines, that is, between the same potentials, so that they are almost zero. This means that the bit line capacitances causing a hindrance to transmission of memory cell data may be reduced, so that a higher data transfer rate may be achieved.

Figure 6:
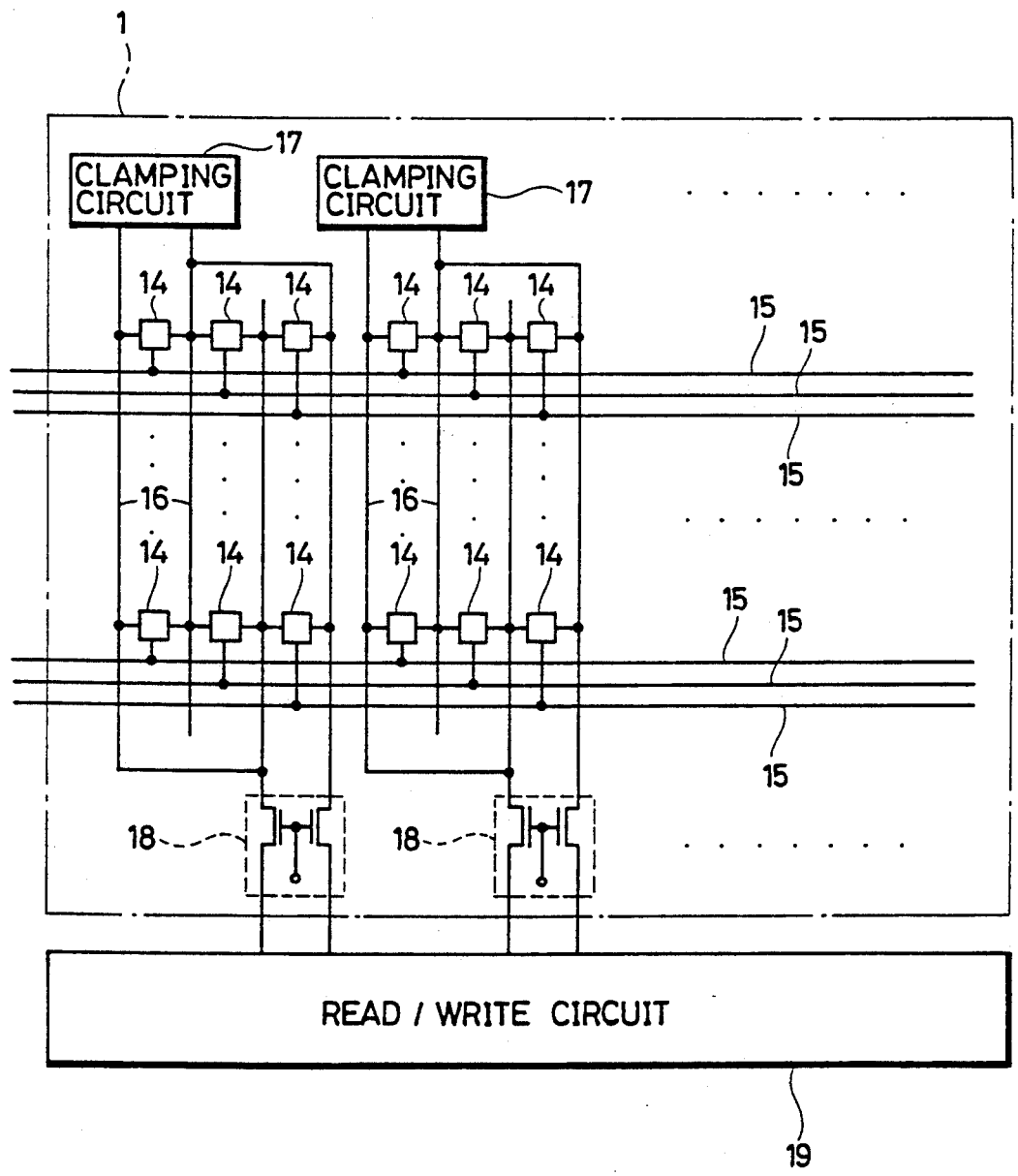
FIG. 6 is a block diagram showing a sixth embodiment of the present invention.

FIG. 6 is a block diagram showing the construction of a memory cell array of a static RAM according to a sixth embodiment of the present invention. The sixth embodiment is a modification of the fifth embodiment shown in FIG. 5 in that the turned down portions of the identical bit lines are combined together. Consequently, in the sixth embodiment, similarly to the fifth embodiment, the arrangement pitches of the clamping circuit 17, the column select gate 18 and the read/write circuit 19 are tripled to increase the degree of freedom in designing these circuits correspondingly. On the other hand, the number of bit lines per memory cell may be reduced to realize a higher degree of circuit integration.

Figure 7:
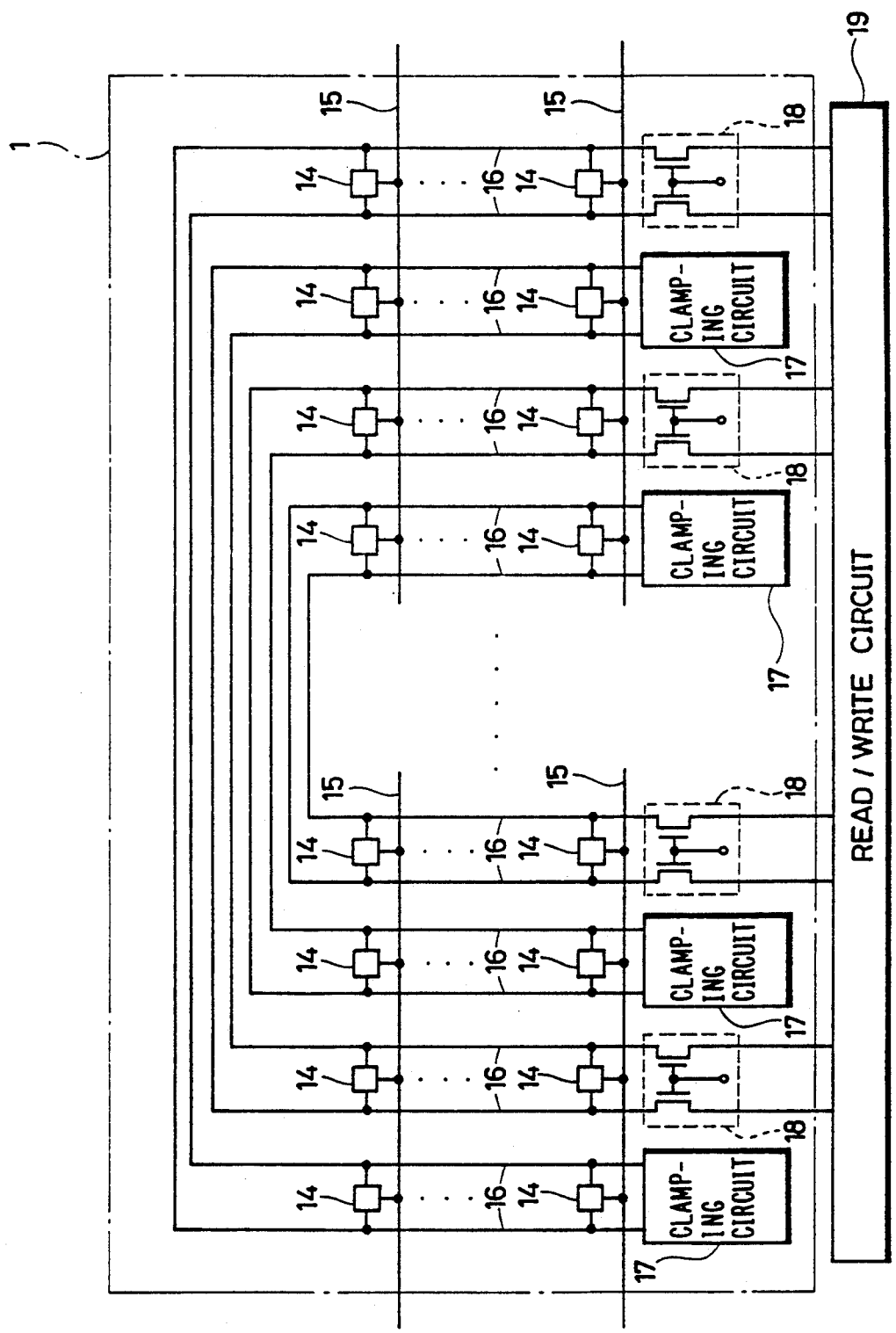
FIG. 7 is a block diagram showing a seventh embodiment of the present invention.

FIG. 7 is a block diagram showing the construction of a memory cell array of a static RAM according to a seventh embodiment of the present invention. The embodiment of FIG. 7 is a combination of the embodiments of the first and the second embodiments in that a plurality of bit line pairs are bent collectively so that the clamping circuits 17 and the column select gates 18 are disposed alternately in straight line. Consequently, similarly to the first embodiment shown in FIG. 1, the pitch of the memory cell columns is not dominated by only the width of the clamping circuit 17, so that a higher degree of circuit integration may be achieved. On the other hand, the pitch of the read/write circuit 19 is doubled to increase the degree of freedom in such designing. Although two word lines are required in the aforementioned first embodiment for each memory cell row, only one word line suffices if word line driving means, not shown, are provided at both ends of the memory cell array, so that the degree of freedom in circuit designing may be increased correspondingly.

Figure 8:
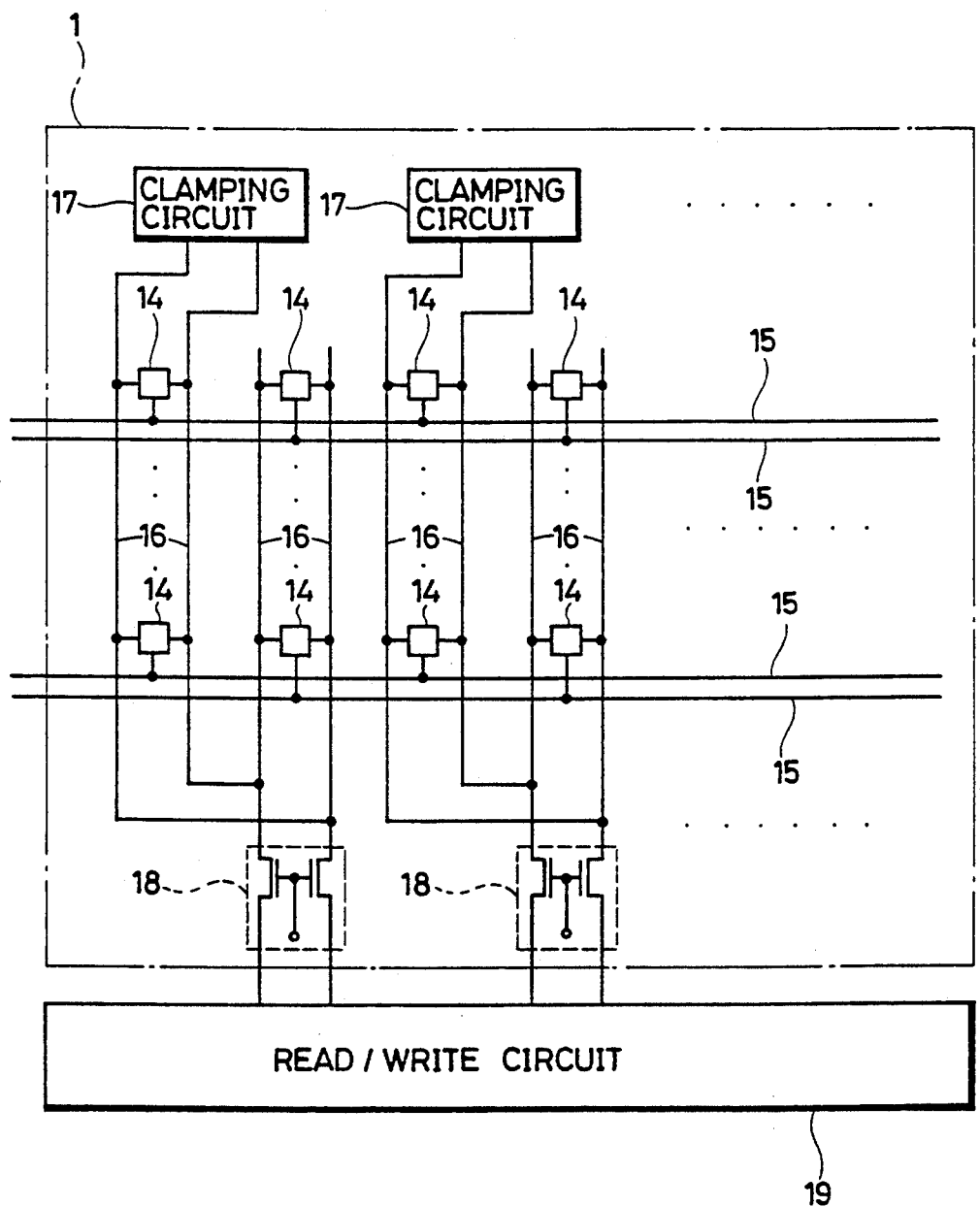
FIG. 8 is a block diagram showing a eighth embodiment of the present invention.

FIG. 8 is a block diagram showing the construction of a memory cell array of a static RAM according to an eighth embodiment of the present invention. The eighth embodiment is a modification of the third embodiment shown in FIG. 3 in that, while the bit line pair 16 is branched in the third embodiment with the clamping circuit 17 as the branching point, the bit line pair is branched in the eighth embodiment with the column select gate 18 as the branching point. The clamping circuit 17 is connected to one end of one of the branches of the bit line pair 16. Hence, in the present eighth embodiment, similarly to the third embodiment, the arrangement pitches of the clamping circuit 17, the column select gate 18 and the read/write circuit 19 may be doubled to increase the degree of freedom in circuit designing.

Figure 9:
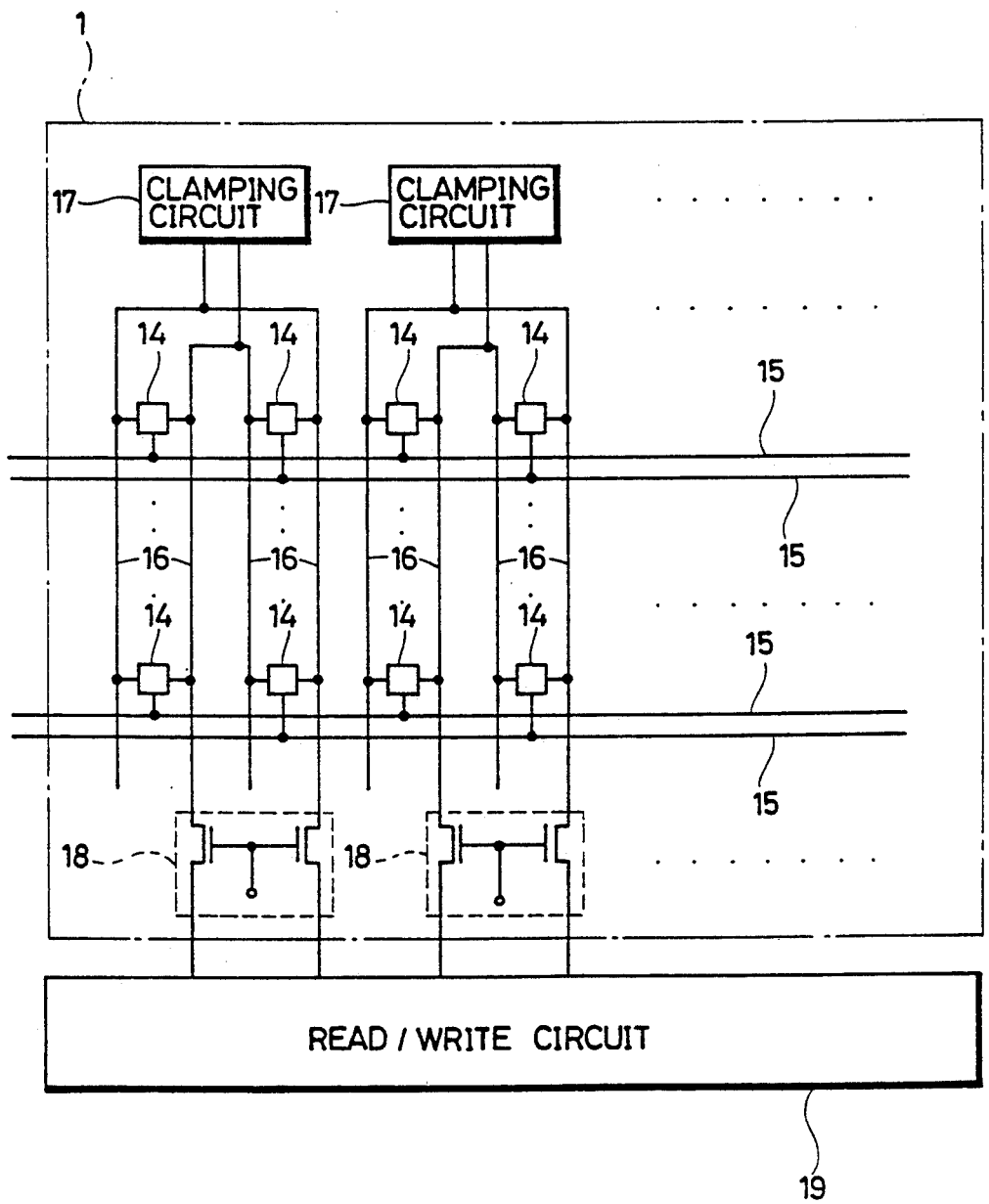
FIG. 9 is a block diagram showing a ninth embodiment of the present invention.

FIG. 9 is a schematic block diagram showing the construction of a memory cell array of a static RAM according to a ninth embodiment of the present invention. The ninth embodiment is a modification of the third embodiment shown in FIG. 3 in that the interval between the MOS transistors making up the column select gate 18 is enlarged. By such arrangement, the degree of freedom in circuit designing of the column select gate 18 may be improved.

In the foregoing, the present invention has been described as being applied to a static semiconductor memory device, such as a static RAM. However, the present invention may be applied to any semiconductor memory devices having bit lines, such as dynamic semiconductor devices, to produce similar effects.

Figure 10A:
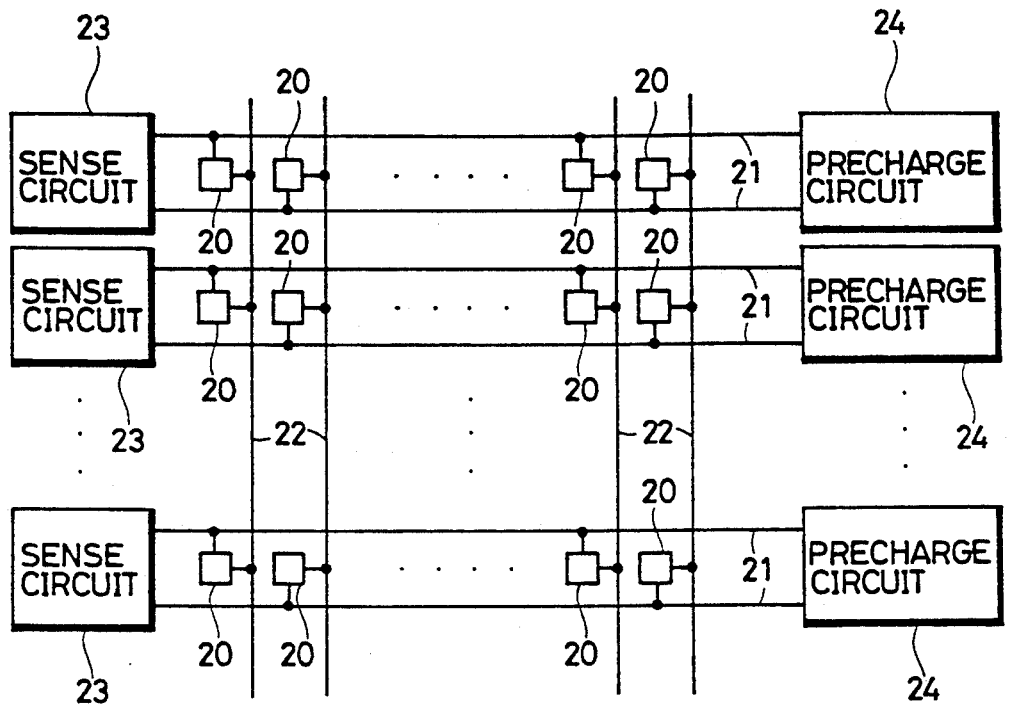
FIG. 10A is a block diagram showing the construction of a conventional dynamic RAM.

For example, FIG. 10A is a block diagram showing a memory cell array of a conventional dynamic RAM, in which a plurality of two-dimensionally arranged memory cells are interconnected by bit lines 21 in the column direction and by the word lines 22 in the row direction. Sense circuits 23 are connected to respective one ends of the bit line pairs 21 to place the sense circuits in a straight line, while precharge circuits 24 are connected to the respective other ends of the bit line pairs 21 to place the precharge circuits 24 in a straight line. In the present embodiment of FIG. 10A, similarly to the static RAM shown in FIG. 12, the pitch of the memory cell columns is dominated by the sense circuits 23 having a larger width.

Figure 10B:
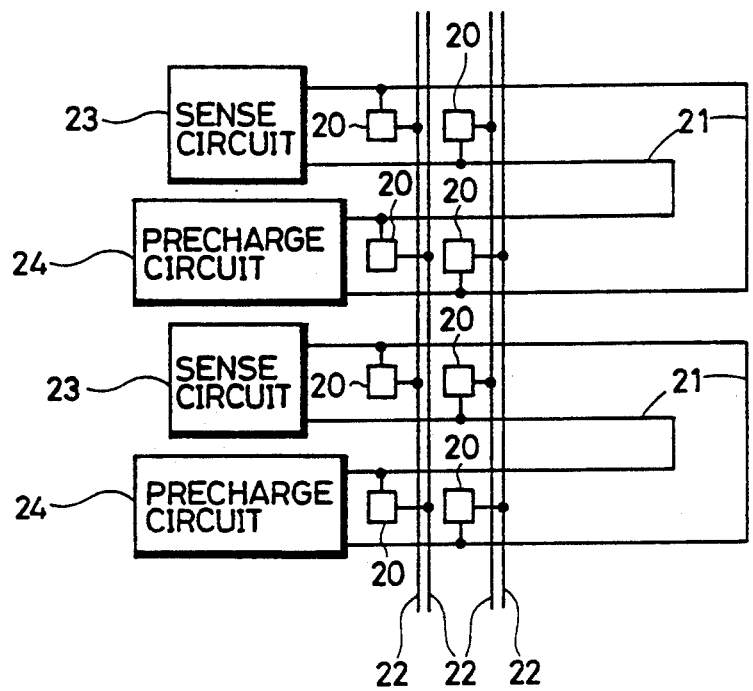
FIG. 10B is a block diagram showing an embodiment in which the present invention is applied to a dynamic RAM.
Figure 11:
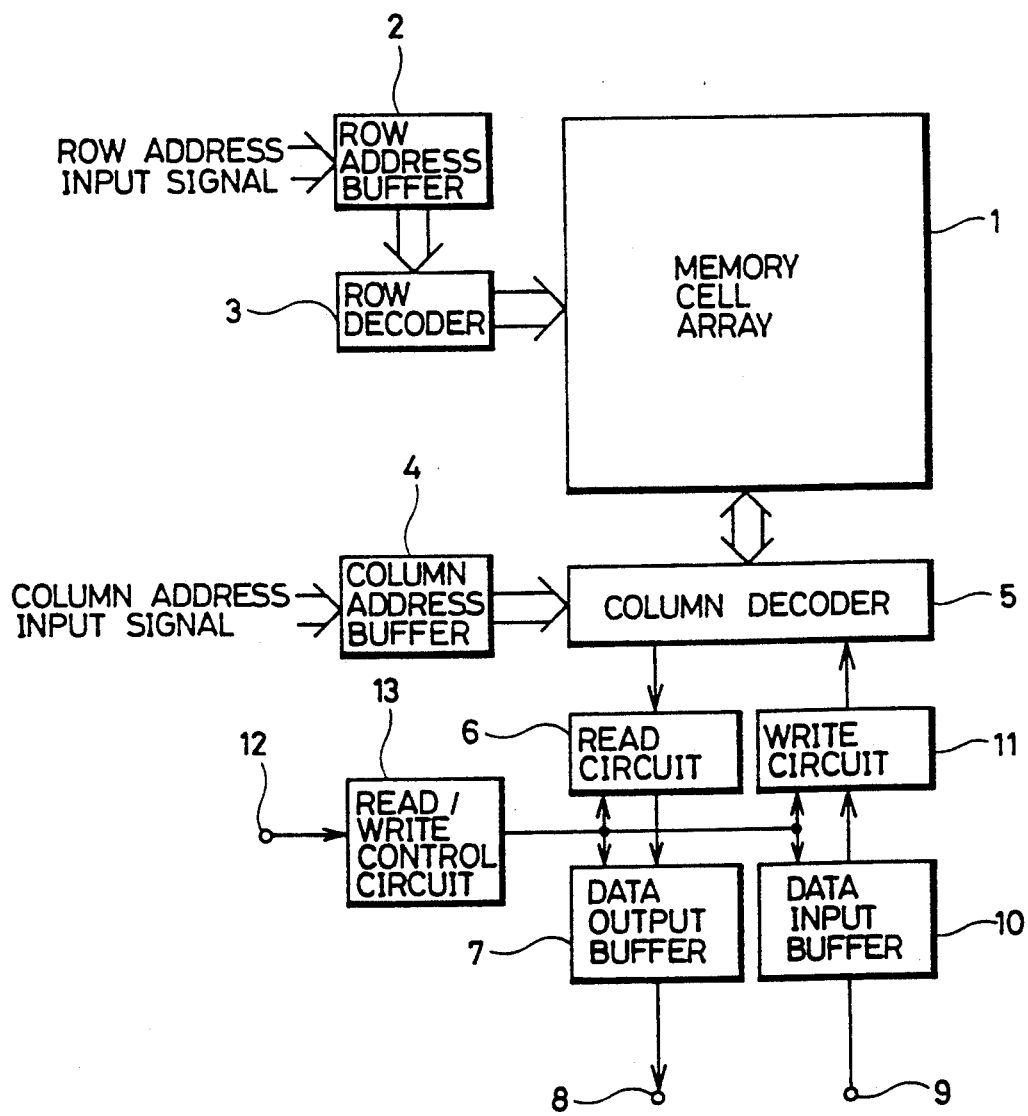
FIG. 11 is a schematic block diagram showing the construction of a conventional static RAM.

In FIG. 10B, the present invention is applied to a dynamic RAM. Similarly to the static RAM according to the first embodiment shown in FIG. 1, each bit line pair 21 is bent once halfway in the two-dimensional form of a letter U, so that the sense circuit 23 and the precharge circuit 24 are disposed alternately in a straight line. As a result, the pitch of the memory cell columns is not dominated only by the sense circuits 23 so that the space allowance around the precharge circuits 24 may be utilized by other circuits.

Although the construction of a memory cell array comprised in one horizontal plane has been described in the above embodiments, bit line bending may be realized using the interconnections disposed in two different layers to produce similar effects.

As described hereinabove, according to the embodiments of the present invention, (1) bit line pairs are bent in substantially the two-dimensional form of a letter U at at least one position, (2) first circuits each having a predetermined function and second circuits each having a different function are disposed alternately, (3) the bit lines are branched with at least one of the first circuit and the second circuit as the branching point, or (4) the above described arrangements (1) to (3) are suitably combined together, so that it becomes possible to release the constraint on the arrangement pitch of the memory cell and its peripheral circuits on a semiconductor chip to realize a higher degree of integration as well as to increase the degree of freedom in circuit designing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array comprising a plurality of memory cells physically arranged two-dimensionally in rows and columns,
   a plurality of word lines each connected to memory cells in a respective row;
   a plurality of bit lines each being bent at at least one location into substantially the form of a letter U and interconnecting memory cells in two or more columns;
   selecting means for selecting one of said memory cells, and
   means for performing at least reading data out of a selected memory cell; wherein
   said bit lines form bit line pairs for respective columns of said memory cells, and wherein the semiconductor memory device further comprises
   first circuit means connected to respective one ends of said bit line pairs and having a predetermined function, and
   second circuit means connected to the respective other ends of said bit line pairs and having a predetermined function different from that of said first circuit means,
   said bit line pairs are bent, each at one location, substantially in the two-dimensional form of a letter U, whereby said first circuit means and said second circuit means are disposed alternately on one straight line.

2. The semiconductor memory device according to claim 1, wherein
   one of said first circuit means and said second circuit means is connected to said data read-out means.

3. A semiconductor memory device comprising:
   a memory cell array comprising a plurality of memory cells physically arranged two-dimensionally in rows and columns,
   a plurality of word lines each connected to memory cells in a respective row;
   a plurality of bit lines each being bent at at least one location into substantially the form of a letter U and interconnecting memory cells in two or more columns;
   selecting means for selecting one of said memory cells, and
   means for performing at least reading data out of a selected memory cell; wherein
   said bit lines form bit line pairs for respective columns of said memory cells, and wherein the semiconductor memory device further comprises
   first circuit means connected to respective one ends of said bit line pairs and having a predetermined function, and
   second circuit means connected to the respective other ends of said bit line pairs and having a predetermined function different from that of said first circuit means,
   each of said bit line pairs being bent at two locations substantially in the two-dimensional form of a letter U.

4. The semiconductor memory device according to claim 3, wherein
   one of said first circuit means and said second circuit means is connected to said data read-out means.

5. The semiconductor memory device according to claim 4, wherein
   the inner bit lines of the bit line pairs bent in the two-dimensional form of a letter U are combined together.

6. A semiconductor memory device comprising:
   a memory cell array comprising a plurality of memory cells physically arranged two-dimensionally in rows and columns,
   a plurality of word lines each connected to memory cells in a respective row;

a plurality of bit lines interconnecting memory cells in respective columns, said bit lines having first ends and second ends, a plurality of first circuit means each connected to corresponding ones of said first ends of said bit lines and having a predetermined function, a plurality of second circuit means each connected to corresponding ones of said second ends of said bit lines and having a predetermined function different from the function of said firs circuit means, selecting means for selecting one of said memory cells, and data read-out means for reading data out of a selected memory cell, said first and second circuit means being disposed alternately on at least one straight line parallel to the row direction.

7. A semiconductor memory device comprising:

a memory cell array comprising a plurality of memory cells physically arranged two-dimensionally in rows and columns, a plurality of word lines each connected to memory cells in a respective row;

a plurality of bit lines interconnecting memory cells in respective columns, said bit lines having first ends and second ends, a plurality of first circuit means each connected to corresponding ones of said first ends of said bit lines and having a predetermined function, a plurality of second circuit means each connected to corresponding ones of said second ends of said bit lines and having a predetermined function different from the function of said first circuit means, selecting means for selecting one of said memory cells, and data read-out means for reading data out of a selected memory cell, said first and second circuit means being disposed alternately on at least one straight line parallel to the row direction, wherein said data read-out means includes first data read-out means and second data read-out means arranged peripherally to the ends of said bit lines on opposite sides of said memory cell array, said first and second circuit means being disposed alternately on a straight line at each of said opposite sides of said memory cell array; and wherein said first circuit means at a first of said opposite sides is connected to said first data read-out means and said first circuit means at a second of said opposite sides is connected to said second data read-out means.

8. A semiconductor memory device comprising:

a memory cell array composed of a plurality of memory cells arranged two-dimensionally in the row direction and in the column direction and each adapted for storing a unit of information, a plurality of word lines interconnecting said memory cells in the row direction, a plurality of bit lines interconnecting said memory cells in the column direction, first circuit means connected to said bit lines and having a predetermined function, second circuit means connected to said bit lines and having a predetermined function different from the function of said first circuit, selecting means for selecting one of said memory cells, and means for performing at least reading out of the data with respect to the selected memory cell, said plurality of bit lines being disposed so as to be branched two-dimensionally with at least one of said first circuit means and said second circuit means as a branching point.

9. The semiconductor memory device according to claim 7, wherein said bit lines form bit line pairs for respective columns of said memory cells, said first circuit means or the second circuit means other than the circuit means functioning as the branching point being connected to said data read-out means.

10. The semiconductor memory device according to claim 9, wherein said circuit means connected to said data read-out means are connected to both ends of the associated bit line pair.

11. The semiconductor memory device according to claim 9, wherein the inner bit lines of the branched bit line pairs are combined together.

12. The semiconductor memory device according to claim 8, wherein said bit lines form bit line pairs for respective columns of said memory cells, and wherein said first circuit means or said second circuit means functioning as the branching point is connected to said data read-out means.

* * * * *